United States Patent [19]

Matsushita et al.

[11] Patent Number: 4,571,610

[45] Date of Patent: Feb. 18, 1986

[54] SEMICONDUCTOR DEVICE HAVING ELECTRICALLY INSULATING SUBSTRATE OF SIC

[75] Inventors: Yasuo Matsushita; Yukio Takeda; Kousuke Nakamura, all of Hitachi; Tokio Ohkoshi, Toyohashi, all of Japan

[73] Assignee: Hitachi, Ltd., Tokyo, Japan

[21] Appl. No.: 450,566

[22] Filed: Dec. 16, 1982

Related U.S. Application Data

[63] Continuation-in-part of Ser. No. 203,554, Nov. 5, 1980, Pat. No. 4,370,421.

[30] Foreign Application Priority Data

Nov. 5, 1979 [JP]  Japan ................................ 54-142059
Jun. 6, 1980 [JP]  Japan ................................ 55-75601
Nov. 4, 1980 [EP]  European Pat. Off. .......... 8010679.9

[51] Int. Cl.[4] ..................... H01L 23/36; H01L 23/14; H01L 23/08; H01L 23/54
[52] U.S. Cl. ........................................ 357/67; 357/81; 357/80

[58] Field of Search ...................... 357/67, 65, 81, 80; 252/63 C

[56] References Cited

U.S. PATENT DOCUMENTS

| | | | |
|---|---|---|---|
| 3,993,602 | 11/1976 | Prochazka | 252/504 |
| 4,172,109 | 10/1979 | Smoak | 264/65 |
| 4,352,120 | 9/1982 | Kurihara et al. | 357/65 |
| 4,370,421 | 1/1983 | Matsushita et al. | 264/65 |

FOREIGN PATENT DOCUMENTS 56-15047  2/1981  Japan .................... 357/81

Primary Examiner—Martin H. Edlow
Assistant Examiner—S. V. Clark
Attorney, Agent, or Firm—Antonelli, Terry & Wands

[57] ABSTRACT

Disclosed are semiconductor devices in which an electrical insulating substrate is made of a sintered silicon carbide body having thermal conductivity of at least 0.4 cal/cm·sec·°C. at 25° C., electrical resistivity of at least $10^7$ ohm·cm at 25° C. and coefficient of thermal expansion of $3.3 \sim 4 \times 10^{-6}/$°C. at 25° C. to 300° C.

11 Claims, 6 Drawing Figures

SEMICONDUCTOR DEVICE HAVING ELECTRICALLY INSULATING SUBSTRATE OF SIC

CROSS-REFERENCE TO RELATED APPLICATION

This is a continuation-in-part application Ser. No. 203,554, filed Nov. 5, 1980, titled "ELECTRICALLY INSULATING SUBSTRATE AND A METHOD OF MAKING SUCH A SUBSTRATE", now U.S. Pat. No. 4,370,421.

BACKGROUND OF THE INVENTION

This invention relates to a semiconductor device having an electrically insulating substrate of SiC and more particularly to a semiconductor device in which one or more semiconductor elements are mounted on an insulating silicon carbide substrate having high thermal conductivity and high electrical resistivity.

The semiconductor industry has made a remarkable progress in recent years and a number of circuit constituents such as semiconductor chips have been formed in increasingly higher density on an insulating substrate used in large scale integration circuit and the like. Demands for devices having greater capacity with smaller size have also become keener and insulating substrates having high thermal diffusivity have been required.

As materials for such an insulating substrate, there has conventionally been employed an alumina sintered body. Since the alumina sintered body does not have satisfactory thermal diffusivity, however, development of an insulating substrate having higher thermal diffusivity has been requested. The insulating substrate for such an application must satisfy the following requirements.

(1) high electrically insulating property,
(2) high thermal conductivity,
(3) its coefficient of thermal expansion is approximate to that of silicon, and
(4) high mechanical strength.

A sintered body of silicon carbide has a coefficient of thermal expansion of $3.7 \times 10^{-6}/°C$. which is smaller than the coefficient of thermal expansion of alumina, i.e., about $8 \times 10^{-6}/°C$. and is approximate to that of silicon, i.e., about $3.3 \times 10^{-6}/°C$. As to the mechanical strength of silicon carbide, its bending strength is at least 50 kg/mm$^2$, the value being by far higher than that of alumina, i.e., 25 to 30 kg/mm$^2$. Further, the thermal conductivity of silicon carbide sintered body is 0.1 to 0.2 cal/cm·sec·°C., which is at least three times that of alumina.

Silicon carbide is a semiconductor compound of the Group IV—IV consisting of carbon and silicon. For this reason, it has been believed difficult to obtain a high density sintered body of silicon carbide with high electrical resistivity and as a matter of fact, no such sintered body has been found to this date.

On the other hand, it has been known well that since silicon carbide is a compound having high covalent bond, it is hard and tough and is stable both in oxidation resistance and corrosion resistance even at a temperature of 1,500° C. or above. Due to this strong covalent bond, however, it is a material from which a high density sintered body can not be obtained easily.

Various sintering aids have been employed in order to obtain a high density sintered body of silicon carbide. U.S. Pat. No. 4,172,109, for example, discloses a sintered body of silicon carbide which is sintered while Be is added as the aid. This prior art relates to a high strength material obtained by sintering the raw powder of silicon carbide which contains 0.5 to 5 wt.% of excessive carbon. However, the sintered body thus formed has small electrical resistivity and can not be used as an electrically insulating material.

SUMMARY OF THE INVENTION

It is an object of the present invention to provide a semiconductor device having an electrically insulating substrate consisting of sintered silicon carbide ceramic which has extremely high thermal conductivity and a thermal expansion coefficient approximate to that of silicon.

The electrically insulating substrate employed in the present invention is featured by sintered silicon carbide ceramic which has an electrical resistivity of at least $10^7$ $\Omega$cm at 25° C. and a thermal conductivity of at least 0.4 cal/cm·sec·°C. at 25° C. The silicon carbide ceramic used in the invention contains beryllium, preferably in an amount of 0.1 to 3.5% by weight based on the total weight of the ceramic.

The silicon carbide ceramic containing beryllium (hereinafter referred to as SiC-Be ceramic) is produced by adding beryllium or beryllium containing compounds preferably in the form of powder to silicon carbide powder which is the principal component, say at least 90% by weight together with one or more optical additives or a binder; thoroughly mixing the powders; pressure-molding the mixed powder; and then sintering the resulting molded article at such a temperature and pressure sufficient to provide at least 90% relative density. Here, aluminum, boron and free carbon components in the mixture of silicon carbide powder and beryllium or beryllium compound powder are restricted to at most 0.1 wt.%, at most 0.1 wt.% and at most 0.4 wt.%, respectively. The thermal conductivity at 25° C. of the electrically insulating substrate obtained from this sintered body is at least 0.4 cal./cm·sec·20 C. while its electrical resistivity at 25° C. is at least $10^{17}$ ohm·cm. Further, its coefficient of thermal expansion from 25° C. to 300° C. is up to $3.7 \times 10^{-6}/°C$.

Beryllium can be added to the silicon carbide powder in the form of elemental beryllium or beryllium compounds such as BeO, Be(OH)$_2$, Be(NO$_3$)$_2$, BeSO$_4$, BeCO$_3$, Be(HCO$_3$)$_2$, Be$_4$O(HCO$_2$)$_6$, BeC$_2$H$_4$, Be$_2$C, Be$_4$O(CH$_3$CO$_2$)$_6$, (NH$_4$)$_2$O.BeO.2C$_2$O$_3$, (NH$_4$)$_2$Be(SO$_4$)$_2$, or Be(CH$_3$COCHCOCH$_3$). Among the above compounds other than BeO, Be$_2$C, they may be converted into BeO, Be$_2$C and/or Be after sintering the molded articles. If a higher resistivity of larger than about $10^{13}$ $\Omega$-cm is needed, BeO is recommended. If a relatively lower resistivity such as about $10^7$ $\Omega$-cm or larger is satisfactory, Be$_2$C or B can be used.

In the present invention, the amount of beryllium in the sintered body is preferably controlled to from 0.1 to 3.5 wt.% for the following reason. If it is below 0.1 wt.%, the electrical resistivity becomes smaller than $10^7$ ohm·cm while if it exceeds 3.5 wt.%, the thermal expansion coefficient of the sintered body tends to become greater than $4 \times 10^{-6}/°C$., which may cause a problem when the sintered body is used as an insulating substrate especially for a large electric powder silicon semiconductor elements.

While beryllium may be added in elemental beryllium or its compounds it is advisable to add beryllium as BeO. The addition is made by mixing the BeO powder and the silicon carbide powder. If about 0.5 to 14 wt.% of BeO is added in this case, Be in the sintered body accounts for about 0.1 to 3.5 wt.%. However, these values vary to some extents depending upon the atmosphere and temperature during the sintering.

It is another important requirement in the present invention that the silicon carbide powder does not contain more than 0.4 wt.% of free carbon. The presence of free carbon in such an amount markedly reduces the electrical resistivity as one of the objects of the present invention.

In the present invention, the abovementioned beryllium oxide powder and silicon carbide powder are minute powder having an average grain size of up to 10 μm, preferably up to 2 μm, and the powder is sintered by hot-pressing. Though aluminum and boron are not contained preferably in the sintered body, there is no problem if their contents are below 0.1 wt.%, respectively. If aluminum is contained in a greater amount, the electrical resistivity of the sintered body becomes below $10^7$ ohm·cm disadvantageously. If boron is contained in a greater amount, the thermal conductivity becomes smaller than 0.4 cal/cm·sec·°C.

If it is desired to obtain a sintered body having a thermal conductivity of at least 0.5 cal/cm·sec·°C., it is recommended to sinter the silicon carbide powder whose principal component is alpha-type SiC.

The sintering condition of the molded article of silicon carbide powder and BeO powder is also an important factor, and specifically, sintering must be carried out in a non-oxidizing atmosphere. In an oxidizing atmosphere, the surface of the silicon carbide powder is oxidized so that a high density sintered body can not be obtained. On the other hand, furnace materials that can be used in an oxidizing atmosphere at a temperature of about 2,000° C., are not available at present.

The sintering temperature is from 1,850° to 2,500° C., preferably from 1,900° to 2,300° C. If the temperature is lower than 1,850° C., a high density sintered body can not be obtained while at a sintering temperature higher than 2,500° C., sublimation of silicon carbide becomes so vigorous that the sintered body is excessively sintered and hence, is not changed into a compact ceramic. In the hot press method which applies a high pressure to the sample during sintering, the upper limit of the pressurizing load varies with the material of dies to be employed. Generally, the dies are made of graphite and in that case, a pressure of up to about 700 kg/cm² may be applied.

Generally it is possible to obtain a high density sintered body without applying such a great pressure. A preferable pressure ranges from 100 to 300 kg/cm². If the silicon carbide powder having a sub-micron grain size is employed, a compact sintered body (relative density of at least 90%) can be obtained without applying the pressure. The optimum sintering time can be determined in accordance with the grain size of the raw powder, the sintering temperature and the load applied during the sintering. Generally speaking, a high density sintered body can be obtained within a short sintering time if the grain size of the raw material powder is small, the sintering temperature is high and the load applied during the sintering is great.

DETAILED DESCRIPTION OF THE PREFERRED EMBODIMENTS

Figure 1:
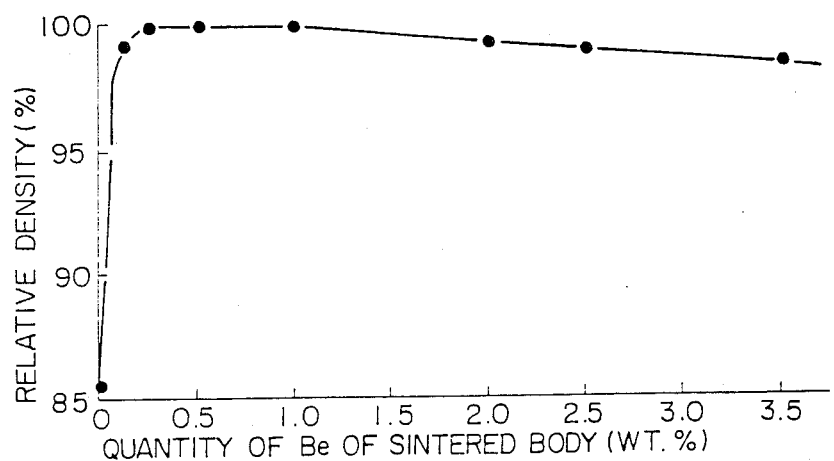
FIG. 1 is a diagram showing the relationship between the Be quantity in the sintered body and the relative density of the sintered body.
Figure 2:
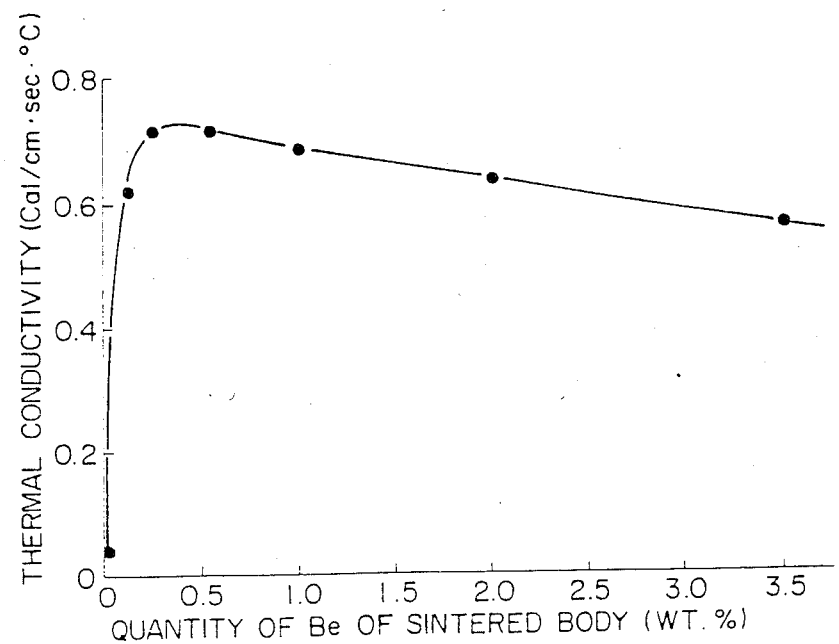
FIG. 2 is a diagram showing the relationship between the Be quantity and the thermal conductivity of the sintered body at 25° C.
Figure 3:
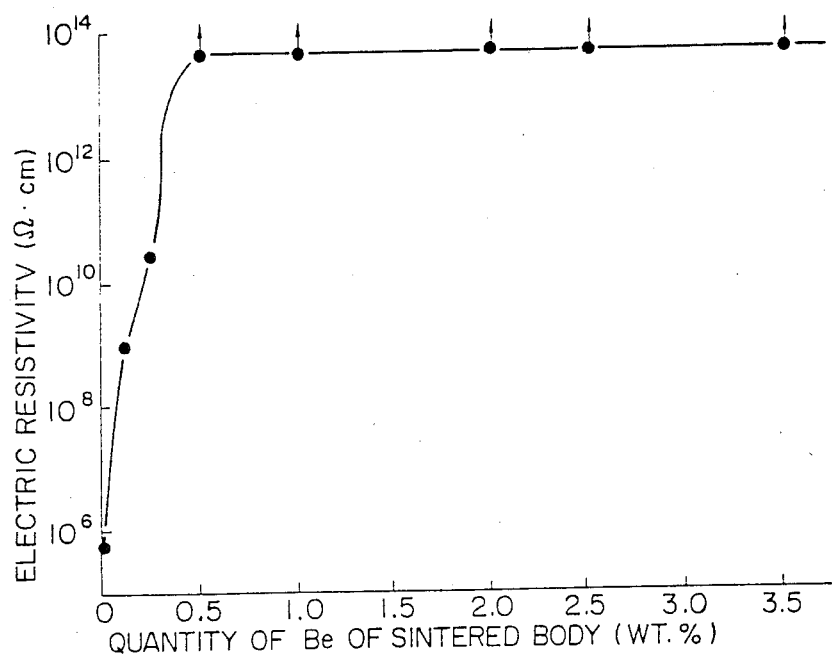
FIG. 3 is a diagram showing the relationship between the Be quantity and the electrical resistivity of the sintered body at 25° C.
Figure 4:
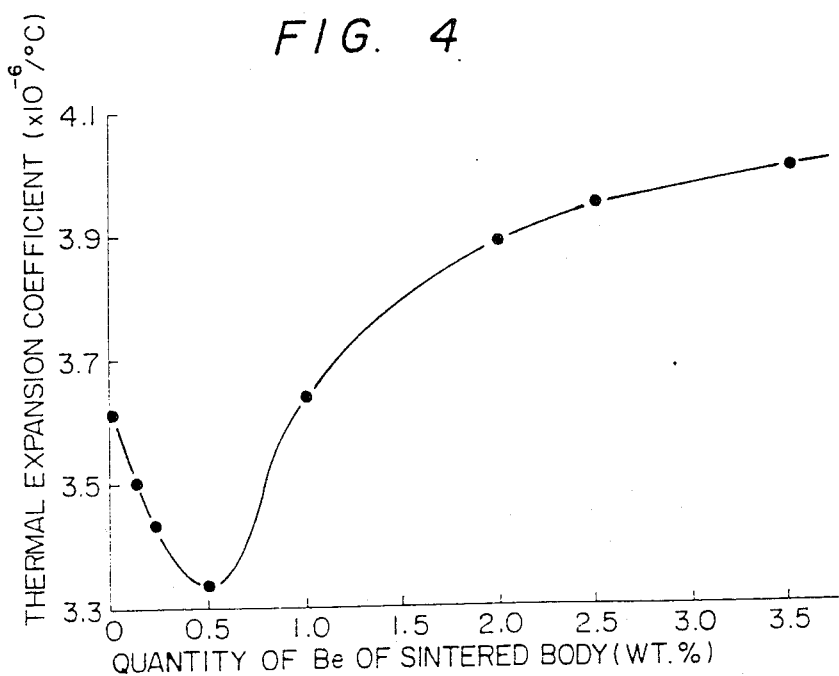
FIG. 4 is a diagram showing the relationship between the Be quantity and the coefficient of thermal expansion of the sintered body from 25° C. to 300° C.

Hereinafter, the present invention will be described more definitely with reference to embodiments thereof.

Production Example 1

Be quantity to be added

Beryllium oxide powder having a grain size of up to 10 μm was mixed with silicon carbide powder of an average grain size of 2 μm in an amount of 0.1 to 20 wt.%. The mixture was shaped into a mold at a room temperature by applying a pressure of 1,000 kg/cm². The mold had a density of 1.60 to 1.67 g/cm³ (50 to 52% relative density with respect to the theoretical density of silicon carbide). Next, the molded article was placed in a graphite die and was sintered by a hot press method at a reduced pressure of $1 \times 10^{-5}$ to $1 \times 10^{-3}$ Torr. The sintering pressure was 300 kg/cm² and the temperature was raised from room temperature to 2,000° C. in the course of about two hours, was held at 2,000° C. for one hour and was then left cooling by cutting off a heating power source. The pressure was released after the temperature fell below 1,500° C. The relationship between the properties of the silicon carbide sintered body thus produced and the Be quantity is shown in FIGS. 1 through 4.

The results of FIGS. 1 through 4 illustrate that if the Be quantity in the silicon carbide sintered body falls within the range of 0.1 to 3.5 wt.%, there can be obtained a sintered body having high density, high thermal conductivity, high electrical resistivity and low coefficient of thermal expansion ($4 \times 10^{-6}$/°C. or below).

Production Example 2

Condition of hot-press

Mixed powder formed by adding 2 wt.% of BeO powder to silicon carbide powder was hot-pressed in the same way as in Production Example 1, yielding a sintered body. The Be content in the sintered body in this instance was about 0.4 wt.%. In this example, various sintered bodies were produced by changing the hot-press conditions. Table 1 illustrates the relationship between the properties of the resulting sintered bodies and the hot-press conditions. When sintering was effected at a temperature of 1,850° to 2,500° C. and at a pressure of at least 100 kg/cm², there could be obtained sintered bodies having at least 90% density relative to the theoretical density, thermal conductivity of at least 0.4 cal/cm·sec·°C., electric resistivity of at least $10^{11}$ ohm·cm and coefficient of thermal expansion of about $4.0 \sim 3.3 \times 10^{-6}/°C$.

TABLE 1

| Temp. (°C.) | Pressure (kg/cm²) | Time (h) | Relative Density (%) | Thermal Conductivity (cal/cm · sec · °C.) | Electrical Resistivity (Ω · cm) | Coefficient of Thermal Expansion ($\times 10^6$/°C.) |
| --- | --- | --- | --- | --- | --- | --- |
| 1800 | 300 | 0.5 | 71 | 0.08 | $10^5$ | 3.34 |
| 1850 | 300 | 0.5 | 88 | 0.18 | $10^9$ | 3.33 |
| 2000 | 300 | 0.5 | 98 | 0.67 | $10^{13}$ or more | 3.33 |
| 2200 | 300 | 0.5 | 99 | 0.70 | $10^{13}$ or more | 3.32 |
| 2400 | 300 | 0.5 | 96 | 0.59 | $10^{13}$ or more | 3.34 |
| 2500 | 300 | 0.5 | 90 | 0.40 | $10^{13}$ or more | 3.34 |
| 2000 | 50 | 1.0 | 74 | 0.08 | $10^6$ | 3.33 |
| 2000 | 100 | 1.0 | 95 | 0.41 | $10^{12}$ | 3.33 |
| 2000 | 700 | 0.5 | 99 | 0.72 | $10^{13}$ or more | 3.33 |
| 2000 | 300 | 0.1 | 95 | 0.54 | $10^{12}$ | 3.34 |
| 2000 | 300 | 1.0 | 100 | 0.72 | $10^{13}$ or more | 3.33 |
| 2000 | 300 | 4.0 | 98 | 0.66 | $10^{13}$ or more | 3.34 |
| 1850 | 300 | 1.0 | 92 | 0.43 | $10^{11}$ | 3.33 |
| 2500 | 100 | 0.3 | 97 | 0.55 | $10^{13}$ or more | 3.34 |
| 2500 | 300 | 0.1 | 98 | 0.51 | $10^{13}$ or more | 3.33 |
| 1850 | 700 | 0.5 | 96 | 0.50 | $10^{13}$ or more | 3.32 |
| 2050*1 | 300 | 1.0 | 98 | 0.60 | $5 \times 10^{11}$ | 3.50 |
| 2050*2 | 300 | 1.0 | 98 | 0.60 | $10^{10}$ | 3.50 |
| 2050*3 | 300 | 1.0 | 98 | 0.60 | $5 \times 10^{10}$ | 3.50 |

*1 An amount of Be₂C is 3.8 weight %.
*2 An amount of Be₂C is 1.8 weight %.
*3 An amount of Be metal is 1.0 weight %.

Remarks:
Thermal conductivity and electrical resistivity were measured at 25° C.
Coefficient of thermal expansion is a mean value of 25° to 300° C.

Production Example 3

Atmosphere

Sintered bodies were produced in the same way as in Production Example 1 except that the BeO quantity was changed to 3 wt.% and the atmosphere was changed to Ar gas, He gas and N₂ gas, respectively. The Be content in the resulting sintered bodies was 0.9 wt.%. The properties of each sintered body were virtually the same as those of the sintered body of Example 1 containing 1 wt.% of Be.

Production Example 4

Grain size of powder

After 2 wt.% of BeO was added to silicon carbide powder having average grain sizes of 0.2 to 20 μm, sintered bodies were produced in the same way as in Production Example 1 by hot-press method. Table 2 illustrates the relationship between the average grain size of the silicon carbide powder and the relative density of the sintered body. It was found that if the average grain size of the silicon carbide raw powder was below 10 μm, the sintered body was rendered compact to relative density of at least 95%, and the sintered bodies rendered compact to relative density of at least 95% exhibited the same characteristics as the sintered body of Example 1 containing 0.4 wt.% beryllium. In the sintered bodies in which the average grain size was greater than 10 μm and in which compactness was not sufficiently accomplished had thermal conductivity of as low as 0.2 cal/cm·sec·°C. or below and the mechanical strength of as low as 10 kg/mm² or below.

TABLE 2

| Average grain size (μm) | Relative density (%) |
| --- | --- |
| 0.2 | 100 |
| 0.5 | 100 |
| 1 | 99 |
| 2 | 99 |
| 5 | 98 |
| 10 | 95 |
| 13 | 86 |
| 20 | 68 |

Production Example

Restriction of free carbon

Mixed powder was formed by adding 2 wt.% of BeO powder and 0.3 to 3 wt.%, based on silicon carbide, of carbon black (minute powder of a grain size of 0.1 μm or below) as an impurity to the silicon carbide powder. The mixed powder was hot-pressed in the same way as in Production Example 1, yielding a sintered body. Thus, various sintered bodies were produced by changing the quantity of the carbon black. Table 3 illustrates the relationship between the carbon black quantity and the properties of the sintered bodies. When the carbon black quantity was 0.5 wt.%, the electrical resistivity of the product became $10^6$ ohm·cm.

TABLE 3

| Carbon black quantity (wt. %) | Relative density (%) | Thermal conductivity (cal/cm · sec · °C.) | Electrical resistivity (Ω cm) | Coefficient of thermal expansion ($\times 10^{-6}$/°C.) |
| --- | --- | --- | --- | --- |
| 0.3 | 99 | 0.70 | $10^{13}$ or more | 3.33 |
| 0.4 | 99 | 0.62 | $10^{13}$ | 3.34 |
| 0.5 | 99 | 0.70 | $10^6$ | 3.34 |
| 1.0 | 98 | 0.53 | $10^5$ | 3.35 |

Remarks:
Thermal conductivity and electrical resistivity were measured at 25° C.
Coefficient of thermal expansion is a mean value of 25° C. to 300° C.

Production Example 6

Restriction of aluminum quantity

Sintered bodies of silicon carbide were produced in the same way as in Example 5 except that aluminum nitride powder (minute powder of a grain size of up to 2 μm) was employed as an impurity instead of carbon black of Example 5. Table 4 illustrates the relationship between the aluminum quantity and the properties of each sintered body when the former was changed. It was found that when the aluminum quantity became smaller than 0.1 wt.%, the electrical resistivity of the sintered body became extremely small.

TABLE 4

| Al content in sintered body (wt. %) | Relative density (%) | Thermal conductivity (cal/cm · sec · °C.) | Electrical resistivity (Ω cm) | Coefficient of thermal expansion ($\times 10^{-6}$/°C.) |
|---|---|---|---|---|
| 0.1 | 99 | 0.63 | $10^8$ | 3.34 |
| 0.3 | 99 | 0.57 | $10^5$ | 3.34 |
| 0.5 | 99 | 0.52 | $10^4$ | 3.34 |

Remarks:

Thermal conductivity and electrical resistivity were measured at room temperature.

Coefficient of thermal expansion is a mean value of room temperature to 300° C.

Production Example 7

Restriction of boron quantity

Sintered bodies of silicon carbide were produced in the same way as in Example 5 except that boron nitride powder (minute powder of a grain size of up to 5 μm) was employed instead of the carbon black of Production Example 5. Table 5 illustrates the relationship between the boron quantity and the properties of the sintered body. It was found that when the boron content was more than 0.1 wt.%, the thermal conductivity of the sintered body was remarkably reduced.

TABLE 5

| B content in sintered body (wt. %) | Relative density (%) | Thermal conductivity (cal/cm · sec · °C.) | Electrical resistivity (Ω cm) | Coefficient of thermal expansion ($\times 10^{-6}$/°C.) |
|---|---|---|---|---|
| 0.1 | 99 | 0.68 | $10^{13}$ or more | 3.33 |
| 0.5 | 99 | 0.30 | $10^{13}$ | 3.34 |
| 1.0 | 98 | 0.12 | $10^{12}$ | 3.35 |

Remarks:

Thermal conductivity and electrical resistivity were measured at room temperature.

Coefficient of thermal expansion is a mean value of room temperature to 300° C.

Production Example 8

Sintering without pressure

As the silicon carbide powder was used one that was synthesized in high frequency heat plasma. The powder was extremely minute powder having a grain size of 200 Å to 0.2 μm. BeO powder of an average grain size of 1 μm was added to the silicon carbide powder. Next, after the mixed powder was molded at a pressure of 1,000 kg/cm², the resulting molded article was sintered in vacuum of $1 \times 10^{-4}$ Torr. Heating was made from room temperature to 2,100° C. in the course of about 2 hours, held at 2,100° C. for 0.5 hour, and was thereafter left cooling by cutting off the heating power heating power source. The Be content in the sintered body was about 0.4 wt.%. Table 6 illustrates the properties of the resulting sintered body. The sintered body was rendered compact and had high thermal conductivity, high electrical resistance and low coefficient of thermal expansion.

TABLE 6

| | |
|---|---|
| Relative density (%) | 99 |
| Thermal conductivity (cal/cm · sec · °C.) | 0.71 |
| Electrical resistivity (ohm · cm) | $10^{13}$ or more |
| Coefficient of thermal expansion ($\times 10^{-6}$/°C.) | 3.33 |

Remarks:

Thermal conductivity and electrical resistivity were measured at room temperature.

Coefficient of thermal expansion is a mean value of room temperature to 300° C.

EXAMPLE

As a definite example of the electrically insulating substrate in accordance with the present invention, a semiconductor power module was produced using the silicon carbide sintered body of 0.5 wt.% beryllium content obtained in Production Example 1. The present invention is, of course, applicable to other types or structures of semiconductors in which an insulating substrate having a thermal expansion coefficient approximate to that of semiconductor material and a high heat conductivity is needed. Semiconductor elements are bonded or fixed to a metallized surface of the sintered body directly or through a metal layer.

Figure 5:
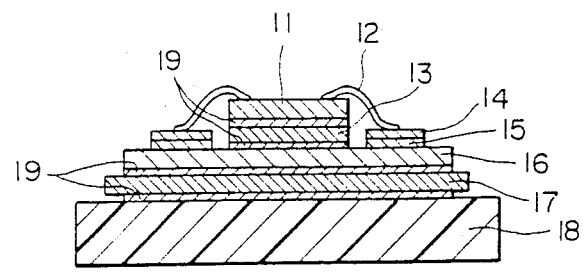
FIG. 5 is a sectional view of a conventional silicon semiconductor device.

FIG. 5 shows the section of a semiconductor power module assembly of the prior art. An organic insulating material 15 is interposed for insulation between a Cu conductor 14 and a Cu heat sink 16 while an alumina substrate 17 is interposed for insulation between the Cu heat sink 16 and a Cu metal support 18. A spacer 13 is interposed in order to mitigate strain due to the difference of thermal expansion coefficients between a silicon element 11 and the Cu heat sink 16. Reference numeral 12 denotes an aluminum lead wire while reference numeral 19 denotes a solder.

Figure 6:
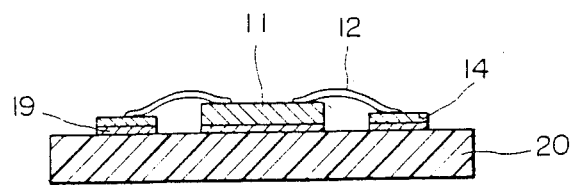
FIG. 6 is a sectional view of a silicon semiconductor device using the insulating substrate of the present invention.

FIG. 6 is a sectional view of the module assembly in accordance with the present invention. The assembly of the present invention has an extremely simple construction in which the substrate is directly brazed to the silicon element 11 via the solder 19. The patterns 14 which may be conventional vacuum evaporated films of such as Cr-Cu-Au, Ti-Mo-Au or Ni-Au may be formed on metallic films which are formed by printing and baking a paste of such as Ni-W, Ni-Mo, Au, Ni, Ag-Pd or Cu, or by any other conventional process.

According to the construction shown in FIG. 6, it is possible to remove the spacer 13, the organic insulating material 15, the Cu heat sink 16, the alumina substrate 17 and the metal support 18, each shown in FIG. 5, by the single substrate 20 shown in FIG. 6. Of course, a heat sink like copper support 18 in FIG. 5 may be employed in the present invention to improve heat dissipation.

Aluminium or gold wires 12 are bonded to metallic patterns 14 and semiconductor element 11 by an ultrasonic bonding method or other conventional technique.

The abovementioned semiconductor device was held at −60° C. for 30 minutes, then at room temperature for 5 minutes and thereafter heated to 125° C. and held at that temperature for 30 minutes. When this heat cycle was applied 20 times to the semiconductor device of the prior art shown in FIG. 5, crack occurred on the alumina substrate and soldered positions peeled off. When the same heat cycle was applied 150 times to the semiconductor device of the present invention shown in FIG. 6, no abnormality was observed.

COMPARATIVE EXAMPLE 1

A sintered body was hot-pressed in the same way as in Production Example 1 except that no additive was added. The properties of the resulting sintered body were shown in Table 7. Since the sintered body was not rendered compact, all of the thermal conductivity, electrical resistivity and mechanical strength were low.

TABLE 7

| | |
|---|---|
| Relative density (%) | 56 |
| Thermal conductivity (cal/cm · sec · °C.) | 0.04 |
| Electrical resistivity (ohm · cm) | $10^4$ |
| Coefficient of thermal expansion ($\times 10^{-6}$/°C.) | 3.66 |

Remarks:
Thermal conductivity and electrical resistivity were measured at room temperature.

Coefficient of thermal expansion is a mean value of room temperature to 300° C.

COMPARATIVE EXAMPLE 2

Two percents by weight (2 wt.%) of aluminum oxide was added as an additive to the silicon carbide powder. The mixed powder was molded and hot-pressed in the same way as in Example 1, yielding a sintered body. The properties of the sintered body were shown in Table 8. Though the mechanical strength was high, the thermal conductivity as well as electrical resistivity were low. Similar properties were obtained when aluminum carbide, aluminum nitride and aluminum phosphate were respectively added as the additive to the silicon carbide powder.

TABLE 8

| | |
|---|---|
| Relative density (%) | 99 |
| Thermal conductivity (cal/cm · sec · °C.) | 0.18 |
| Electrical resistivity (ohm · cm) | 10 |
| Coefficient of thermal expansion ($\times 10^{-6}$/°C.) | 3.38 |

Remarks:
Thermal conductivity and electrical resistance were measured at room temperature.

Coefficient of thermal expansion is a mean value of room temperature to 300° C.

The silicon carbide sintered body employed in the semiconductor devices of the present invention is characterized by its high compactness, high thermal conductivity, high electrical resistivity and low coefficient of thermal expansion. The sintered body of the invention is excellent as the aforementioned electrically insulating substrate.

What we claimed is:

1. A semiconductor device in which at least one semiconductor element is disposed on an electro-insulative silicon carbide sintered body of an electrical resistivity of $10^7$ Ω-cm or more at 25° C. and of a linear thermal expansion coefficient of not larger than $4.0 \times 10^{-6}$, said sintered body having a relative density of not less than 90%.

2. A semiconductor device comprising at least one semiconductor element disposed through a metallic film on an electro-insulative silicon carbide sintered body and a metallic substrate carrying the sintered body; the silicon carbide sintered body containing at least 90% by weight of silicon carbide and less than 3.5% by weight of beryllium, having an electrical resistivity of $10^3$ ohm·cm or more, a thermal conductivity of 0.5 to 0.75 cal/cm·sec·°C. and a relative density of 96 to 100%.

3. A semiconductor device which comprises at least one semiconductor element disposed through a metallic film on an electro-insulative silicon carbide body containing BeO in an amount of 0.1 to 3.5% by weight of Be.

4. A semiconductor device according to claim 1 or claim 3, wherein the sintered body consisting essentially of 0.1 to 3.5 wt.% of beryllium, up to 0.1 wt.% of aluminum, up to 0.1 wt.% of boron, up to 0.4 wt.% of free carbon the balance being silicon carbide; said sintered body having density of at least 90% relative density with respect to the theoretical density of said silicon carbide and thermal conductivity of at least 0.4 cal/cm·sec·°C. at 25° C., electrical resistivity of at least $10^7$ ohm·cm at 25° C. and coefficient of thermal expansion of up to $4 \times 10^{-6}$/°C. from 25° C. to 300° C.

5. A semiconductor device according to any one of claims 1 to 3, wherein alpha-type silicon carbide is the principal component of said silicon carbide.

6. A semiconductor device according to claim 1 or claim 3, wherein the sintered body has an electrical resistivity of $10^{13}$ ohm·cm or more, a thermal conductivity of 0.5–0.75 cal/cm·sec·°C., and a relative density of 96–100%.

7. A semiconductor device according to claim 1 or claim 3, wherein the sintered body has a relative density of 90% or more, said sintered body consisting essentially of 0.1 to 3.5% by weight of beryllium in the form of beryllium oxide and a balance of silicon carbide, said sintered body being produced by sintering a mixture consisting essentially of beryllium oxide and a balance substantially of silicon carbide having an average grain size of up to 10 μm in a non-oxidizing atmosphere at 1850° to 2500° C.

8. A semiconductor device according to claim 1, wherein the silicon carbide sintered body contains at least 90% by weight of silicon carbide and less than 3.5% by weight of beryllium, and has an electrical resistivity of $10^{13}$ ohm·cm or more, a thermal conductivity of 0.5 to 0.75 cal/cm·sec·°C. and a relative density of 96 to 100%.

9. A semiconductor device according to claim 1, wherein the silicon carbide sintered body consists essentially of silicon carbide and beryllium in an amount sufficient to render the sintered body electro-insulative and to give the body a thermal conductivity of at least 0.4 cal/cm·sec·°C.

10. A semiconductor device according to claim 2, wherein the sintered body consists essentially of 0.3 to 3.5 wt. % of beryllium, up to 0.1 wt. % of aluminum, up to 0.1 wt. % of boron, up to 0.4 wt. % of free carbon, the balance being silicon carbide; said sintered body having a coefficient of thermal expansion of up to $4 \times 10^{-6}$/°C. from 25° C. to 300° C.

11. A semiconductor device according to claim 2, wherein the sintered body consists essentially of 0.1 to 3.5% by weight of beryllium in the form of beryllium oxide and a balance of silicon carbide, said sintered body being produced by sintering a mixture consisting essentially of beryllium oxide and a balance substantially of silicon carbide having an average grain size of up to 10 μm in a non-oxidizing atmosphere at 1850° to 2500° C.

* * * * *